United States Patent [19]

Byun et al.

[11] Patent Number: 5,599,734
[45] Date of Patent: Feb. 4, 1997

[54] METHOD FOR FABRICATING MOS TRANSISTOR UTILIZING DOPED DISPOSABLE LAYER

[75] Inventors: Jeong S. Byun, Chungcheongbuk-do; Sang J. Choi, Chungcheongnam-do, both of Rep. of Korea

[73] Assignee: LG Semicon Co., Ltd., Chungcheongbuk-do, Rep. of Korea

[21] Appl. No.: 479,047

[22] Filed: Jun. 6, 1995

Related U.S. Application Data

[62] Division of Ser. No. 445,580, May 22, 1995, which is a continuation of Ser. No. 208,348, Mar. 9, 1994, abandoned.

[30] Foreign Application Priority Data

Feb. 4, 1994 [KR] Rep. of Korea .................... 2105/1994

[51] Int. Cl.$^6$ .................................................. H01L 21/225
[52] U.S. Cl. ................ 437/164; 437/240; 148/DIG. 144
[58] Field of Search ....................... 437/160, 164, 437/236, 240, 942, 950, 982; 148/DIG. 133, DIG. 144

[56] References Cited

U.S. PATENT DOCUMENTS

| | | | |
|---|---|---|---|
| 3,646,665 | 3/1972 | Kim | 437/164 |
| 4,151,008 | 4/1979 | Kirkpatrick | 437/942 |
| 4,433,008 | 2/1984 | Schnable et al. | 437/164 |
| 5,286,681 | 2/1994 | Maeda et al. | 437/240 |
| 5,395,787 | 3/1995 | Lee et al. | 437/160 |

OTHER PUBLICATIONS

"Silicon Processing for the VLSI ERA, vol. 1: Process Technology"; S. Wolf, Ph.D. and R. N. Tauber, Ph.D., United States Patent and Trademark Office, Jul. 26, 1988.
"An SPDD P–MOSFET Structure Suitable for 0.1 and Sub 0.1 Micron Channel Length and its Electrical Characteristics"; M. Saito, T. Yoshitomi, M. Ono, Y. Akasaka, H. Nii, S. Matsuda, H. S. Momose, Y. Katsumata, Y. Ushiku and H. Iwai; IEEE Meeting Dec. 13–16, 1992.

*Primary Examiner*—Chandra Chaudhari
*Attorney, Agent, or Firm*—Morgan, Lewis and Bockius LLP

[57] ABSTRACT

A method for fabricating an MOS transistor includes the steps of forming a gate insulating layer on a substrate of a first conductivity-type, forming a gate on the gate insulating layer, forming a disposable layer over an entire surface of the substrate and the gate, the disposable layer having a first conductivity-type impurity and a second conductivity-type impurity of a higher concentration than that of the first conductivity-type impurity, and forming a source and drain area of the second conductivity-type impurity on the substrate by diffusing the second conductivity-type impurity of the disposable layer into the substrate by means of an annealing process, wherein the disposable layer includes a BPSG layer, wherein the BPSG layer is a B+PSG layer which is doped with a higher dopant concentration of boron than that of phosphorus to make a p-type MOS transistor.

4 Claims, 6 Drawing Sheets

METHOD FOR FABRICATING MOS TRANSISTOR UTILIZING DOPED DISPOSABLE LAYER

CROSS-REFERENCE TO RELATED APPLICATION

This is a divisional of application Ser. No. 08/445,580, filed May 22, 1995, which is a continuation of application Ser. No. 08/208,348, filed Mar. 9, 1994, now abandoned.

FIELD OF THE INVENTION

This invention relates to a method for fabricating MOS transistor, and more particularly to a method for fabricating MOS transistor having a shallow source/drain junction formed utilizing Chemical Vapor Deposition (CVD) oxide layer as a disposable layer doped with an impurity.

BACKGROUND OF THE INVENTION

An advanced technique for making the highly integrated semiconductor devices makes it possible to integrate the deep submicron MOS transistors, resulting in the requirement of the shallow junction below 0.1 micrometer in 64M DRAM, 256M DRAM or next generation devices. The formation of a shallow junction is currently accomplished by the various methods developed, such as the method utilizing a sidewall spacer, ion implantation process, the semiconductor process without ion implantation process, or the silicide.

The LDD MOS transistor having the formed shallow junction by use of the sidewall spacer has the characteristics of the increased breakdown voltage and mitigated hot carrier effects.

The materials for making LDD MOS transistor has been adopted a high dielectric constant material such as the polysilicon or Si3N4 instead of SiO2, as the integrated density of the devices increases.

Recently, there is provided a method for fabricating LDD MOS transistor having the formed shallow junction by use of the sidewall spacer of in situ boron—doped polysilicon film or Boro Silicate Glass (BSG).

The P+ type source/drain area is formed using B+ or BF2+ as a doping source in case that P channel MOS transistor is made through the ion implant process.

However, it is difficult to form the shallow junction because of the tailing effect and large diffusion coefficient of Boron ion. There has been proposed the method for forming the P type source/drain of the shallow junction, comprising the steps of making the substrate amorphous by use of the big atoms such as Ga+, Ge+, S+, As+ or the like and implanting Boron ions at low energy level of about 10 KeV.

In addition, it was provided the method for forming the shallow junction depth below 1000 angstrom through the implantation at lower energy level of 200keV.

But, there is problem of the leakage current due to the generated crystal defects after the formation of the junction, in the proposed technique for forming the shallow source/drain junction by use of the amorphous substrate.

Without implant process, the shallow junction formation technique enables to prevent the leakage current due to the crystal defects and one may be able to select one of various methods such as SOS(Spin-On Source), GILD(Gas Immersed Laser Doping), PILL(Plasma Immersion Ion Implantation), FIB(Focused Ion Beam), or methods utilizing a layer of BSG or TiB2.

Further, there is provided a method for forming the shallow junction below 500 angstrom by use of the silicide formed from CoSi2 and low energy.

For the reference to the shallow junction formation technique by use of CVD oxide layer doped with the impurities such as BSG or PSG(Phosphor Silicate Glass) without ion implant, it is seen from IEDM Tech, Dig., pp 897–900.

FIG.1 is a sectional view of P channel MOS transistor formed using CVD oxide layer doped with impurities.

A thin insulative film and polysilicon film are deposit over a silicon substrate 11 and then those deposited films are patterned to form a gate insulating layer 12 and a gate 13.

A layer of BSG as the P doped CVD oxide layer is deposited on the whole surface of the resultant structure followed by etch back process to make spacer 14 on sidewall surface of the gate 13. Next, an annealing process of RTA(rapid thermal annealing) is carried out and boron is diffused into the silicon substrate 11 from the side wall spacer 14 of BSG film, thereby forming a highly doped shallow source/drain junction 15.

The heavy P implant is performed with a long range and followed by annealing step, so as to form the highly doped source/drain area 16 with deep junction. Of course, a layer of PSG can be used instead of a layer of BSG when making n type MOS transistor.

In case that p or n type MOS transistor is made using either a layer of BSG or PSG, a layer of BSG consisting of SiO2+B2O3 provides an effect of the reduced fusion temperature of oxide layer which leads to the improved planarization, but has no the gettering effect, whereas a layer of PSG consisting of SiO2+P2O5 provides the gettering of the metal ions such as Na+, but has the high fusion temperature characteristics about a layer of oxide.

Further, another problem resides in the exclusive use of BSG layer for p type MOS transistor and PSG for n type MOS transistor, respectively.

SUMMARY OF THE INVENTION

An object of this invention is to provide a method for fabricating MOS transistor which enables to make N+P or P+N shallow junction using a single BPSG film having both a lower fusion temperature feature of BSG film and the metal atoms gettering effect of PSG film.

According to this invention, the method for fabricating MOS transistor comprises the steps of:

forming a gate insulating layer formed over a first conductivity silicon substrate;

forming a gate on the gate insulating layer;

forming a disposable layer over the whole surface of the substrate, the disposable layer having a first conductivity type impurity and a second conductivity impurity of a higher concentration than that of the first conductivity impurity; and forming a second conductivity impurity area by diffusing the impurity of the disposable layer into the substrate by means of anneal process.

DETAILED DESCRIPTION OF THE INVENTION

A preferred embodiment according to this invention will be described with reference to the accompanying drawings.

Figure 1:
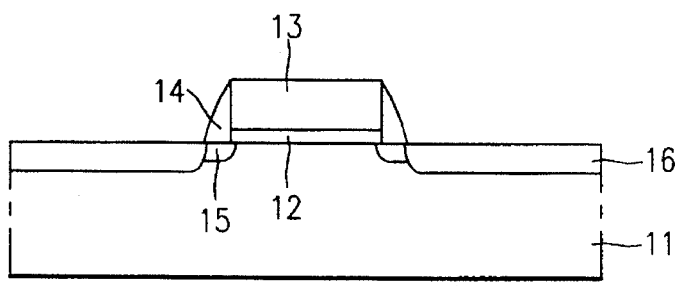
FIG. 1 is a sectional view showing p type MOS transistor formed utilizing BSG layer according to the conventional art.
Figure 2A:
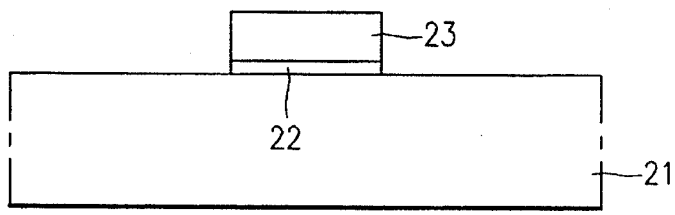
FIGS. 2A to 2C are sectional views explaining the process steps for making MOS transistor utilizing BPSG layer according to the present invention.
Figure 2B:
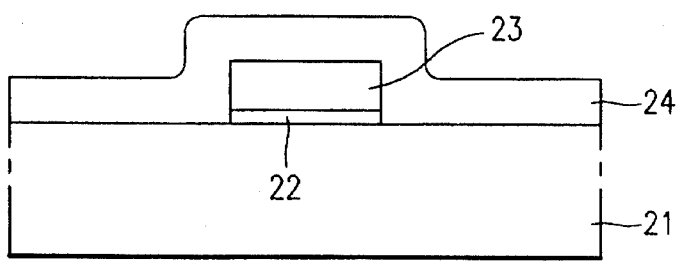
Figure 2C:
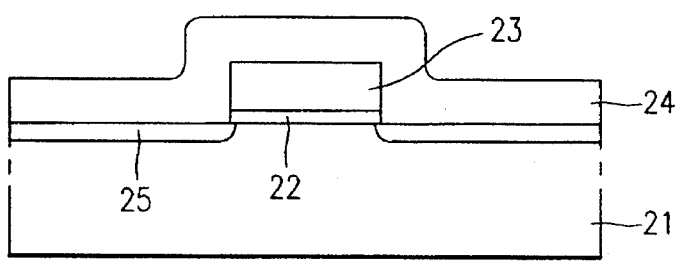

FIGS. 2A through 2C are sectional views showing the process steps according to an embodiment of the present invention.

Referring to FIG. 2A, on a cleaned substrate 21 is deposited a stack of a thin insulative layer and polysilicon layer, and then the stack is patterned to make a gate insulating layer 22 and a gate 23 thereon.

A disposable layer 24 having a first conductivity type impurity and a second conductivity impurity of a higher concentration than that of the first conductivity impurity is formed over the entire surface of the substrate by CVD process, as shown in FIG.2B, and then the resultant structure is subjected to an anneal treatment such as rapid thermal annealing or furnace so that a highly doped source/drain area of a shallow junction can be formed (FIG. 2C).

This embodiment employs BPSG layer as the disposable layer 24, where, when n type silicon substrate 21 is used or p type MOS transistor is made, the BPSG layer is substantially B+PSG layer 24 being doped with a higher dopant concentration of boron than that of phosphorus, in which B+PSG layer is doped with the dosage of 5E21 atoms/cm$^2$ for boron and 1E21 atoms/cm$^2$ for phosphorus. Meanwhile, when p type silicon substrate 11 is used or n type MOS transistor is fabricated, the BPSG layer is substantially BP+SG layer 24 being doped with a higher dopant concentration of phosphorus than that of boron, in which BP+SG layer is doped with the dosage of 1E21 atoms/cm$^2$ for boron and 5E21 atoms/cm$^2$ for phosphorus. It is noted that a layer of B+PSG means BPSG layer being doped with a higher dopant concentration of boron than that of phosphorus, while a layer of BP+SG means BPSG layer being doped with a higher dopant concentration of phosphorus than that of boron.

Figure 3:
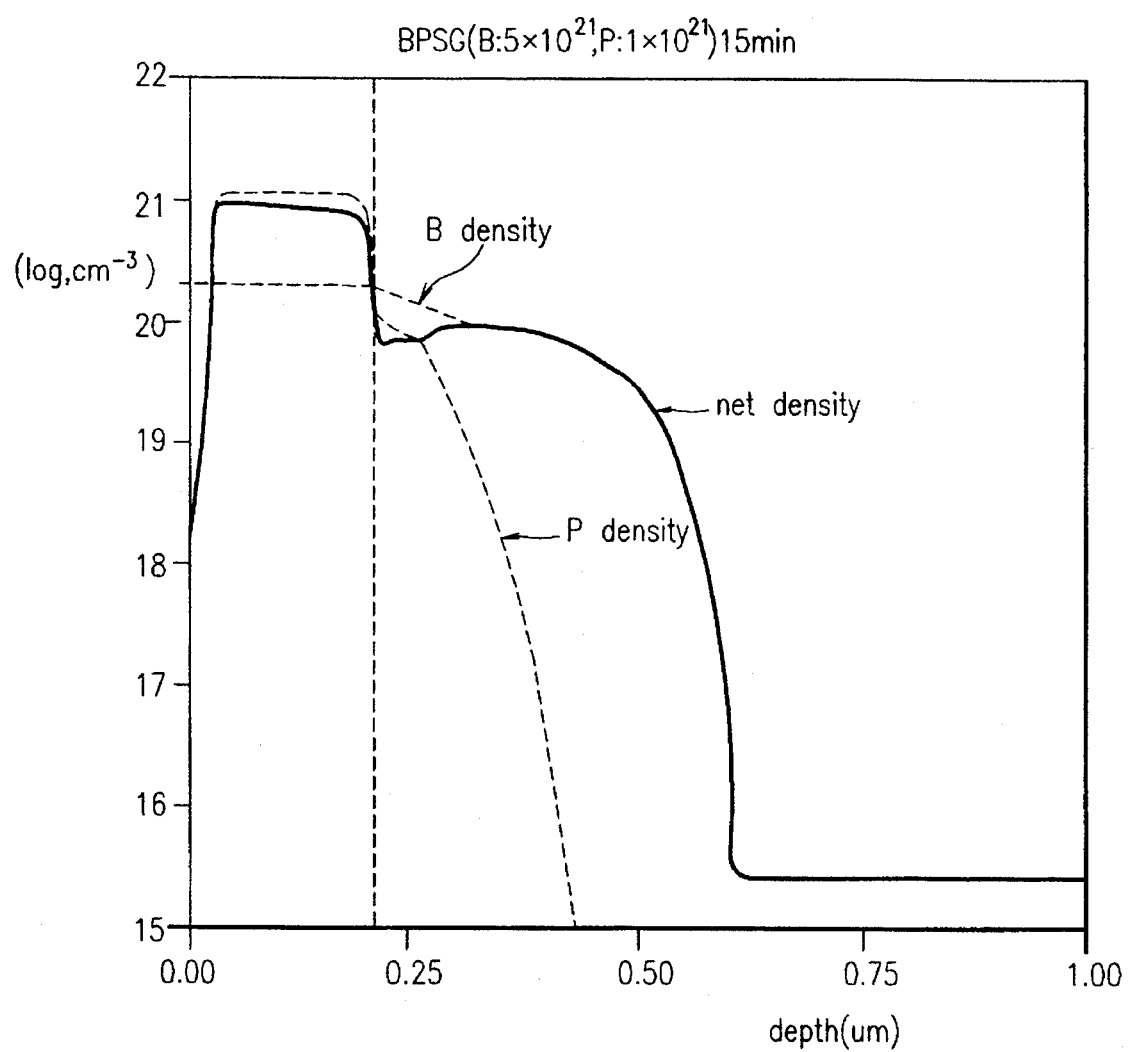
FIG. 3 is a graph showing a source/drain junction concentration profile associated with a layer of B+PSG being doped with a higher dopant concentration of boron than that of phosphorus.

FIG. 3 is a graph showing a junction concentration profile investigated after annealing a layer of B+PSG (B=10 mole %, P=2 mole %) 24 doped with the dosage of 5E21 atoms/cm$^2$ for boron and 1E21 atoms/cm$^2$ for phosphorus.

Figure 4:
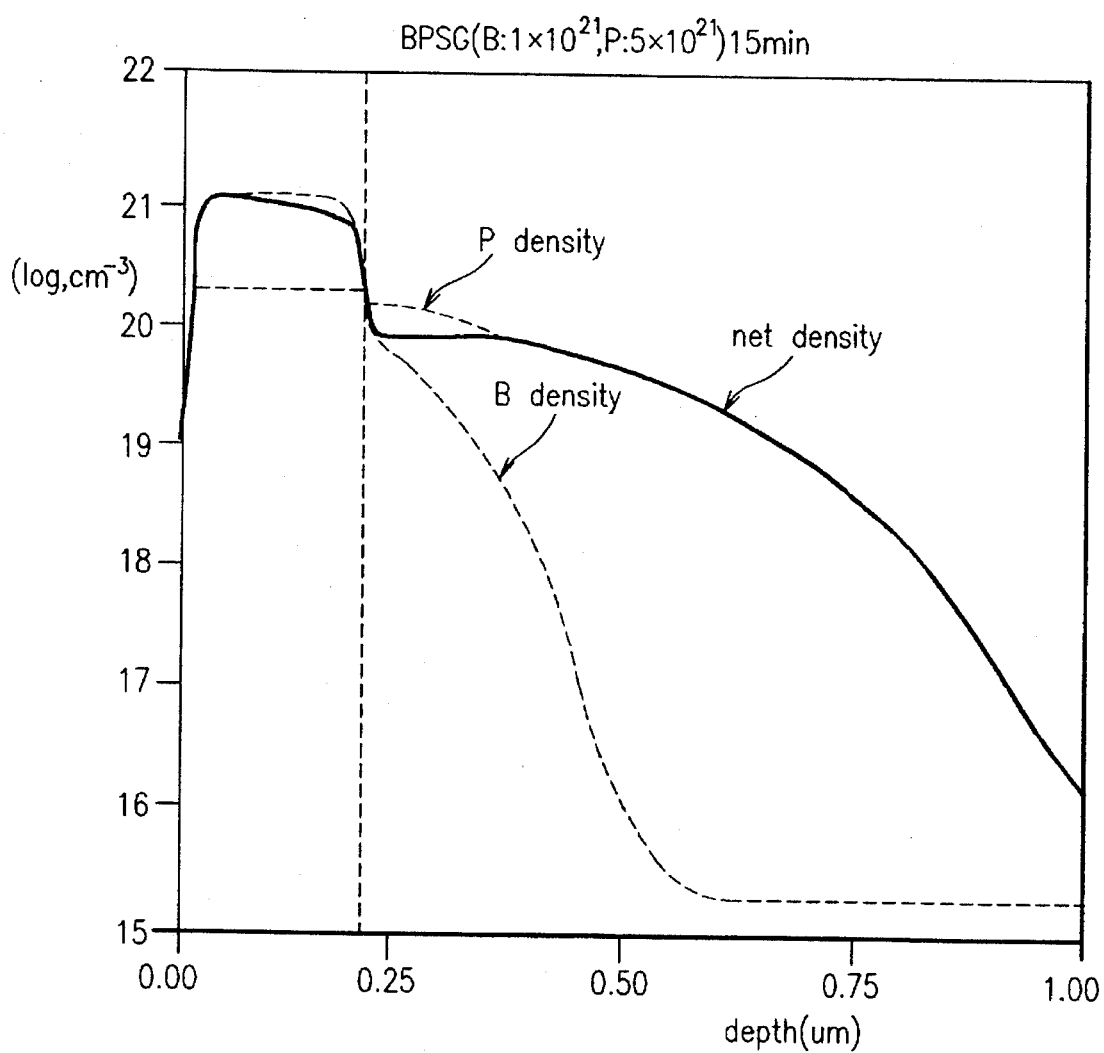
FIG. 4 is a graph showing a source/drain junction concentration profile associated with a layer of BP+SG being doped with a higher dopant concentration of phosphorus than that of boron.

FIG. 4 is a graph showing a junction concentration profile investigated after annealing a layer of BP+SG (B=2 mole %, P=10 mole %) doped with the dosage of 5E21 atoms/cm$^2$ for phosphorus and 1E21 atoms/cm$^2$ for boron.

With reference to FIG.3 and 4, we know that the shallow junction can be obtained using the doped BPSG layer. Since a layer of B+PSG comprises more amount of boron than that of phosphorus, the boron can be deep diffused into the substrate than the phosphorus, thereby making p type source/drain area 25 which forms the shallow p+n junctions associated with the substrate 21, whereas a layer of BP+SG comprises more amount of P than that of B, so the P can be deep diffused into the substrate than the B, to make n type source/drain area 25 which forms the shallow n+p junctions associated with the substrate 21.

Figure 5A:
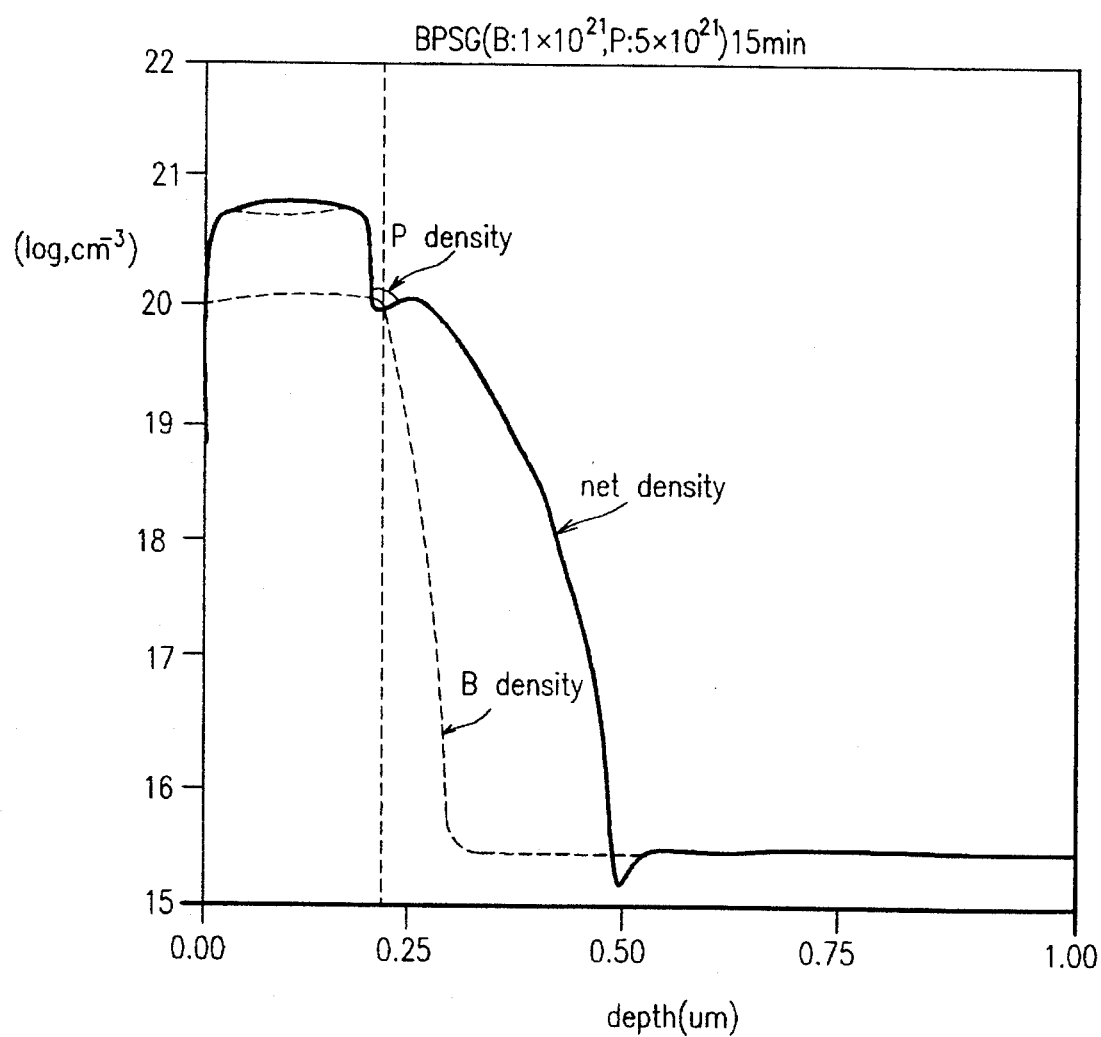
FIGS. 5A and 5B show the junction concentration profile versus the depth for the respective anneal time, with BP+SG layer being doped with a higher dopant concentration of phosphorus than that of boron.
Figure 5B:
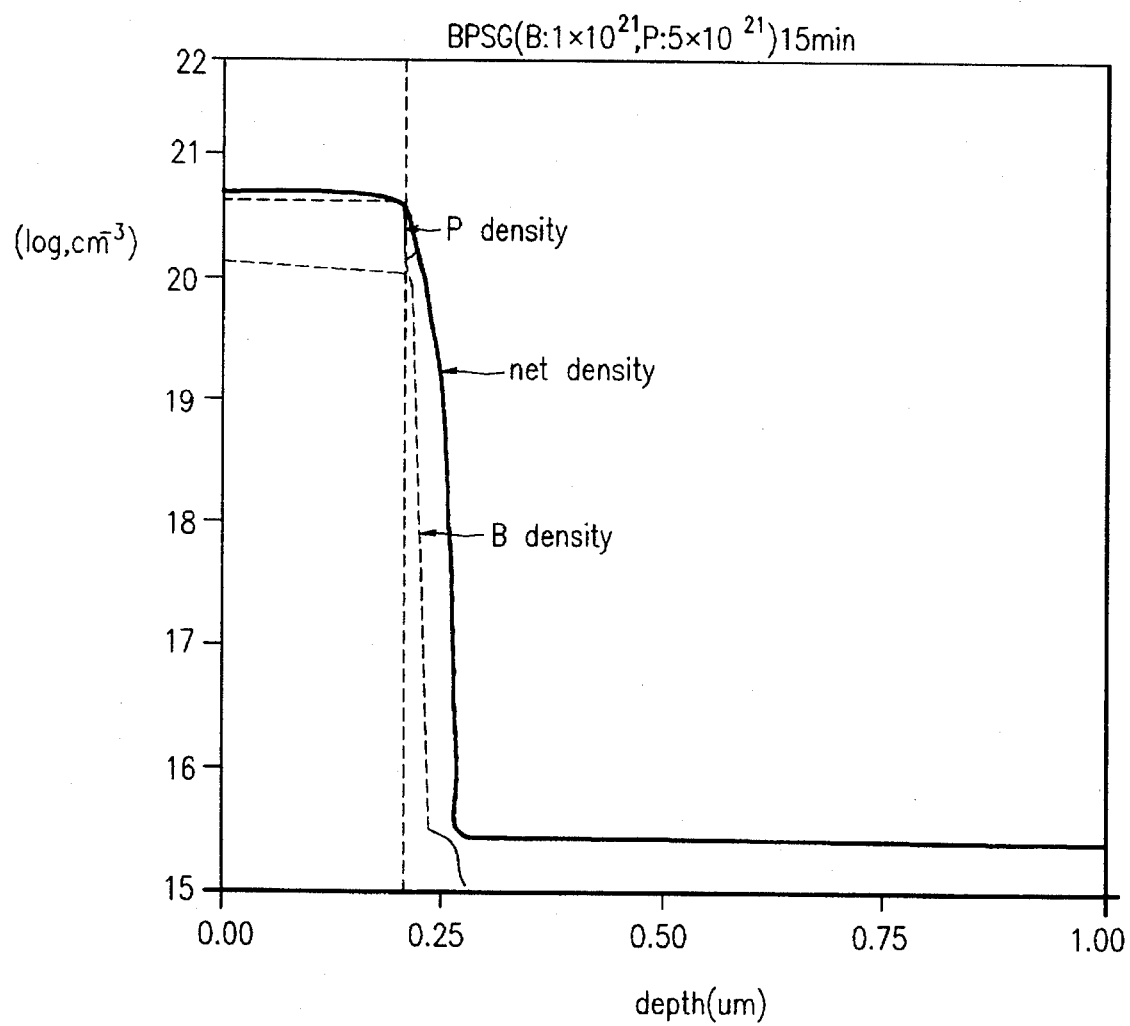

The junction concentration profile versus the depth is plotted in FIGS. 5A and 5B for the anneal time 1.7 min. and 0.15 min., respectively. From FIGS. 5A and 5B, it is known that the longer anneal time is, the deeper junction depth is.

Figure 6:
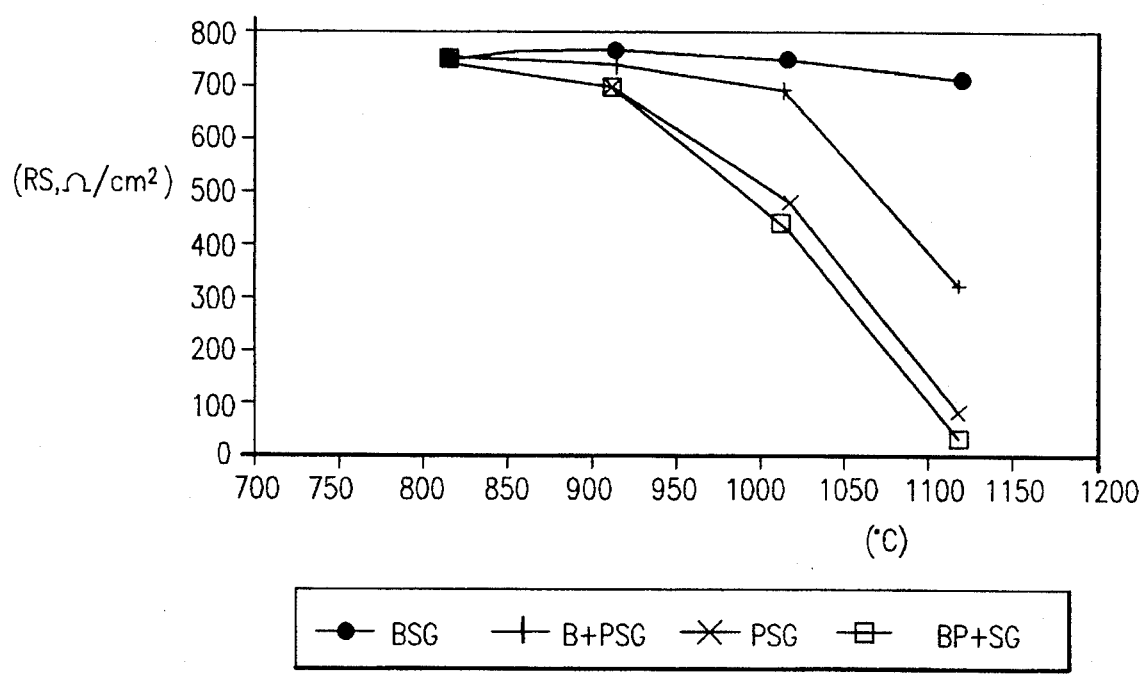
FIG. 6 graphically shows the measured experimental data for the respective sheet resistance of a layer of BSG, PSG, B+PSG and BP+SG under the temperature of 800 to 1100 degrees C.

FIG.6 shows the measured experimental data for the sheet resistance of BP+SG layer of B=2 mole % and P=10 mole %, B+PSG of B=10 mole % and P=2 mole %, PSG of P=10 mole %, BSG of B=10 mole %, respectively, under the temperature of 800 degrees C. to 1100 degrees C.

From FIG. 6, it is known that as the anneal temperature increases, the sheet resistance decreases.

Because the sheet resistance is inversely proportional to the junction depth, the decrease of the sheet resistance means the increase of the junction depth. That is, it can not be formed the shallow source/drain junction because when the anneal temperature increases, the junction depth is deeper.

Referring FIG. 6, the shallow junction below 1000 angstrom can be obtained by annealing below the temperature of 600 degrees C.

Unlike the conventional technique for making MOS transistor by using BSG layer for p type MOS transistor and PSG layer for n type MOS transistor, the invention enables to form n or p type source/drain area using phosphorus and boron doped BPSG layer with the different amount from one another.

Further, an impurity gettering effect of BPSG layer results in the improvement of an electrical characteristics in contact area using a layer of BPSG, compared to that of BSG layer not having the gettering effect.

What is claimed is:

1. A method for fabricating an MOS transistor comprising the steps of:

forming a gate insulating layer on a substrate of a first conductivity-type;

forming a gate on the gate insulating layer;

forming a disposable layer over an entire surface of the substrate and the gate, the disposable layer having a first conductivity-type impurity and a second conductivity-type impurity of a higher concentration than that of the first conductivity-type impurity; and forming a source and drain area of the second conductivity-type impurity on the substrate by diffusing the second conductivity type impurity of the disposable layer into the substrate by means of an annealing process;

wherein the disposable layer includes a BPSG layer;

wherein the BPSG layer is a B+PSG layer which is doped with a higher dopant concentration of boron than that of phosphorus to make a p-type MOS transistor.

2. The method of claim 1, wherein the B+PSG layer has boron and phosphorus dopant concentrations of $5 \times 10^{21}$ atoms/cm$^2$ and $1 \times 10^{21}$ atoms/cm$^2$, respectively.

3. The method of claim 1, wherein the annealing process diffuses boron ions into the source and drain area.

4. The method of claim 1, wherein the disposable layer is deposited through a chemical vapor deposition process.

* * * * *